US012625426B2

(12) United States Patent
Lindenmann et al.

(10) Patent No.: US 12,625,426 B2
(45) Date of Patent: May 12, 2026

(54) PROCESS FOR CREATING A THREE-DIMENSIONAL STRUCTURE IN A LITHOGRAPHY MATERIAL VIA A LASER LITHOGRAPHY DEVICE

(71) Applicant: Nanoscribe Holding GmbH, Eggenstein-Leopoldshafen (DE)

(72) Inventors: Nicole Lindenmann, Niefern-Öschelbronn (DE); Matthias Blaicher, Ettlingen (DE); Jörg Hoffmann, Lustadt (DE)

(73) Assignee: Nanoscribe Holding GmbH, Eggenstein-Leopoldshafen (DE)

( * ) Notice: Subject to any disclaimer, the term of this patent is extended or adjusted under 35 U.S.C. 154(b) by 1029 days.

(21) Appl. No.: 17/712,905

(22) Filed: Apr. 4, 2022

(65) Prior Publication Data

US 2022/0350239 A1     Nov. 3, 2022

(30) Foreign Application Priority Data

Apr. 28, 2021     (DE) ...................... 10 2021 110 860.8

(51) Int. Cl.
| | |
|---|---|
| *G03F 1/44* | (2012.01) |
| *G03F 1/20* | (2012.01) |
| *G03F 7/00* | (2006.01) |

(52) U.S. Cl.
CPC ................. *G03F 1/44* (2013.01); *G03F 1/20* (2013.01); *G03F 7/70375* (2013.01); *G03F 7/70516* (2013.01); *G03F 7/70558* (2013.01); *G03F 7/70025* (2013.01)

(58) Field of Classification Search
CPC ....................................................... G03F 1/44

USPC .......................................................... 716/51
See application file for complete search history.

(56) References Cited

U.S. PATENT DOCUMENTS

| | | | |
|---|---|---|---|
| 5,209,878 | A | 5/1993 | Smalley et al. |
| 9,852,955 | B2 * | 12/2017 | Gehles ................. G01N 21/643 |
| 2016/0101573 | A1 | 4/2016 | Quere et al. |
| 2020/0001541 | A1 | 1/2020 | Eiriksson et al. |

(Continued)

FOREIGN PATENT DOCUMENTS

| | | |
|---|---|---|
| CN | 109997081 A | 7/2019 |
| DE | 10 2016 214 606 B3 | 8/2017 |

(Continued)

*Primary Examiner* — Eric D Lee
(74) *Attorney, Agent, or Firm* — ASLAN LAW, P.C.

(57) ABSTRACT

Method (and apparatus) for producing a 3D target structure in lithographic material. Focus region of a laser writing beam travels through a scanning manifold through the lithographic material. In the focus region of the laser writing beam, an exposure dose is irradiated into the lithographic material, and a structure region is locally defined. At least one exposure data set which represents a local exposure dose for the scan manifold as a function of location is determined. A structure which approximates the target structure is defined based on at least one exposure data set. This structure is analyzed and at least one analysis data set which represents the analyzed structure is determined. Deviation data set which represents deviations of the already defined structure from the target structure is determined. At least one correction exposure data set is determined. Correction structure based on the at least one correction exposure data set is defined.

16 Claims, 4 Drawing Sheets

(56)     References Cited

U.S. PATENT DOCUMENTS

Figure 1:
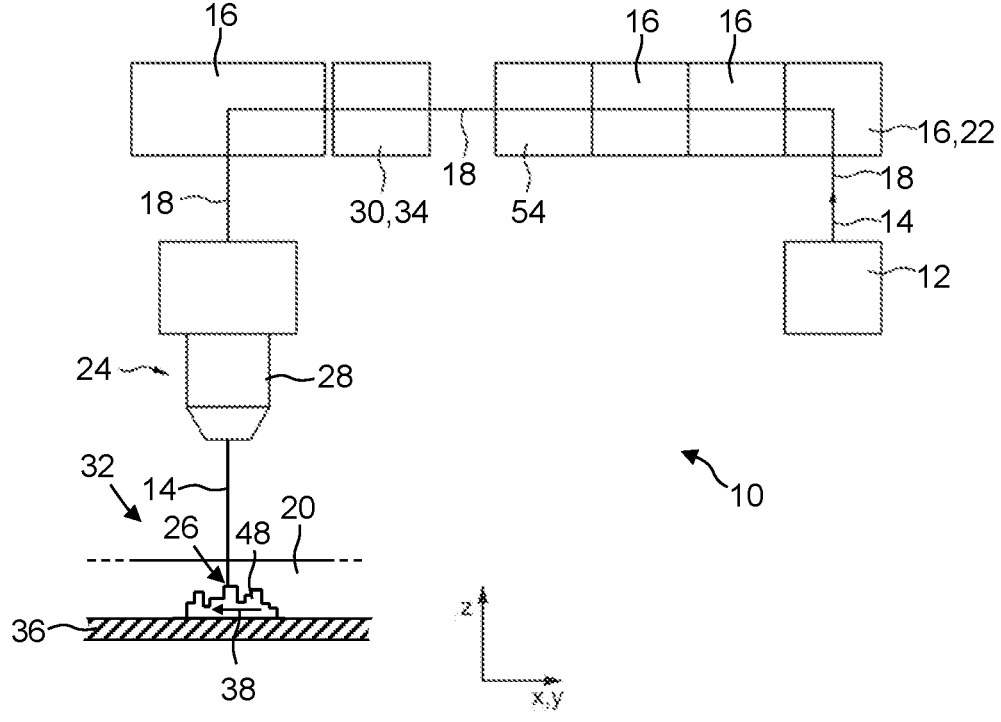

2021/0041788 A1* 2/2021 Van Oosten .............. G03F 1/68
2021/0132502 A1* 5/2021 Robinson ........... G03F 7/70866

FOREIGN PATENT DOCUMENTS

DE      10 2017 110 241 A1    11/2018
EP           3 083 205 B1    10/2016
JP           2019-525249 A     9/2019

* cited by examiner

PROCESS FOR CREATING A THREE-DIMENSIONAL STRUCTURE IN A LITHOGRAPHY MATERIAL VIA A LASER LITHOGRAPHY DEVICE

CROSS-REFERENCE TO RELATED APPLICATIONS

This application claims priority to DE Patent Application No. 10 2021 110 860.8 filed on Apr. 28, 2021, the entire contents of which are hereby incorporated by reference.

The invention relates to a method for producing a three-dimensional target structure in a lithographic material by means of a laser lithography apparatus. The invention also relates to a laser lithography apparatus adapted for the method.

Techniques of this type are used in particular in the production of microstructures or nanostructures in areas in which high precision, and at the same time freedom of design for the structure to be produced, are desired. In such laser lithography methods, a structure is usually written by radiating an exposure dose into a lithographic material in a focus region of a laser writing beam, and thus locally defining a structure region, for example by locally hardening or polymerizing the lithographic material. A three-dimensional overall structure can then be produced by displacing the focus region in the lithographic material.

A laser lithography method is known from DE 10 2017 110 241 A1, in which a surface of a desired structure is produced by locally varying the radiated exposure dose (exposure variation).

In order to be able to produce structures with high precision using such an exposure variation, a connection must be established between the exposure dose and the exposure result. A corresponding calibration process is typically required for this purpose. For this purpose, it is known to produce reference structures with prespecified exposure doses before actually writing a desired structure, then to develop them and subsequently to measure their surface optically or mechanically. Depending on the measurement results, the exposure dose is then usually adjusted accordingly, and the process is repeated iteratively until the result achieved meets the specified requirements. However, such an optimization process is usually time-consuming and difficult to automate. In addition, such a calibration process usually has to be carried out again at certain time intervals.

The object of the invention is to produce a three-dimensional structure with high precision in a lithographic material in a simple and rapid manner.

This object is achieved by a method according to claim 1. The method is a laser lithography method, in particular so-called direct laser writing, by means of a laser lithography apparatus, in a volume of lithographic material and/or in a volume filled with lithographic material. According to the method, a target structure is written and/or defined in the lithographic material by sequentially defining a plurality of structure regions (hereinafter also referred to as "voxels") that add up to form the target structure (that is, by "writing" in the lithographic material with the laser lithography apparatus).

To write the structure regions and thus the target structure, a focus region of a laser writing beam runs through a scan manifold through the lithographic material. In a simple case, the scan manifold can be a scan curve, but it can also be made more complex. In other words, the focus region of the laser writing beam is displaced through the lithographic material. For this purpose, the laser writing beam is controllable within a writing region of the laser lithography apparatus with the precision required for structuring purposes. By way of example, the laser writing beam can be deflected in a controlled manner by means of a beam guide device. However, it is also conceivable for the lithographic material or a substrate having the lithographic material to be displaced in a controlled manner relative to the laser writing beam by means of a positioning device. The two concepts for displacement can also be used together.

An exposure dose is irradiated into the lithographic material in the focus region of the laser writing beam, and, in particular utilizing multi-photon absorption, the lithographic material is locally modified, and thus a structure region is produced or written. In this respect, the lithographic material is structured locally, in particular utilizing multi-photon absorption. In particular, the lithographic material is chemically and/or physically modified, for example hardened or polymerized, by the exposure dose of the laser writing beam. The exposure dose is in particular a volume dose of radiant energy. The size of the modified structure region ("voxels") in the lithographic material depends on the exposure dose. By varying the exposure dose, the spatial expansion of each of the structure regions or voxels, in particular a structure height, can be modified.

Applying the exposure dose by means of multi-photon absorption can be particularly advantageous in the type of 3D laser writing used in the present case. For this purpose, the lithographic material is preferably designed in such a way and the laser writing beam is tuned to the lithographic material in such a way that a change in the lithographic material (for example local polymerization) is only possible by means of the absorption of multiple photons. For this purpose, for example, the wavelength of the laser writing beam can be selected such that—and thus the associated quantum energy can be of such a magnitude that—the energy input required for modifying the lithographic material is only achieved by the simultaneous absorption of two or more quanta. The probability of such a process is not linearly dependent on the intensity, and is significantly increased in the focus region compared to the rest of the writing beam. Careful consideration shows that the probability of absorption of two or more quanta is a function of the square or a higher power of the radiation intensity. In contrast to this, the probability for linear absorption processes shows a different intensity dependence, in particular a lower power of the radiation intensity. Since the penetration of the laser writing beam into the lithographic material is attenuated (for example, according to Beer's law), writing deep below the liquid surface of the lithographic material in the focus region using linear absorption processes would be problematic, since, due to the attenuation, even with a focus below the surface in the focus region, the highest absorption probability is not necessarily given. The mechanism of multi-photon absorption, on the other hand, makes it possible to deliver the desired exposure dose locally even inside a volume of lithographic material, that is, also comparatively deep below the liquid surface, and to modify the lithographic material. Apparatuses for lowering a support structure in a bath of lithographic material in steps, as known in the prior art, are therefore not required.

In order to solve the task, it is proposed in particular that at least one exposure data set is initially provided, which represents a local exposure dose for the scan manifold as a function of location (step a). In particular, the at least one exposure data set can represent a local exposure dose for each scan point along a scan curve of the laser writing beam through the lithographic material. In this respect, the at least one exposure data set specifies the exposure dose to be used at a specific position of the scan manifold. The at least one exposure data set is or can be stored in particular in a memory of a control device of the laser lithography apparatus. The at least one exposure data set can be provided in particular by providing a structure data set (for example CAD data) that represents the target structure to be generated, and/or storing it in a control device, and then using this to determine the at least one exposure data set with computer assistance, for example by means of a control device of the laser lithography apparatus configured for this purpose.

In a further step, a structure approximating the target structure is then defined or generated in the lithographic material on the basis of the at least one exposure data set (step b). For this purpose, in particular, the laser lithography apparatus is controlled in accordance with the at least one exposure data set, such that structure regions are sequentially written in the lithographic material according to the exposure dose specified by the at least one exposure data set.

At least one portion of the already defined structure is then analyzed using an imaging measurement method with spatial resolution (step c). It can be contemplated that the structure is only analyzed after the writing process has been completed. It can also be contemplated that the structure being analyzed is analyzed during the definition thereof (so to speak, "online"). In particular, a topography or shape of the defined structure is measured. In particular, an image can be captured using an optical measuring device, for example based on OCT (optical coherence tomography). It is possible that the complete, already defined, structure is analyzed. However, it is also possible that only sub-regions of the already defined structure are analyzed—for example, those that require special optimization (for example, transition areas that result from the juxtaposition of sub-structures resulting from a delimited write area, see below).

During or after the analysis of the structure, at least one analysis data set, which represents the analyzed structure, in particular its shape or topography, is determined by computer.

A deviation data set is then determined by computer, which represents deviations, in particular in the topography or shape, of the already defined structure from the target structure (step d). The deviation data set is determined in particular by comparing the at least one analysis data set with a structure data set that represents the target structure to be generated. This structure data set can in particular be the at least one exposure data set. Deviations are understood to mean, in particular, a difference between the target topography of the target structure and the actual topography of the structure which is defined on the basis of the at least one exposure data set.

In a further step (step e), at least one correction exposure data set is determined by computer, in particular on the basis of the deviation data set, which represents a correction exposure dose required to compensate for the deviations, as a function of location for the scan manifold.

A correction structure is then generated on the basis of the at least one correction exposure data set (step f).

It can be contemplated that, on the basis of the correction exposure data set, a separate structure is generated, in particular spatially separated from the structure defined on the basis of the exposure data set. The at least one correction exposure data set can then specify an exposure dose, in particular for the scan manifold, as a function of location, wherein the exposure dose is determined in such a way that a structure written on the basis of the correction exposure data set has a smaller deviation from the target structure than the previously written structure based on the exposure data set has from the target structure. It is also possible for the correction structure to be used for post-correction of the structure initially written on the basis of the at least one exposure data set. The at least one correction exposure data set can then specify an exposure dose, in particular for the scan manifold, as a function of location, with the exposure dose being determined in such a way that a deviation between the already defined structure and the target structure is reduced by writing a structure on the basis of the correction exposure data set. For example, the correction structure can be applied to the structure that has already been written.

Such a method makes it possible to characterize a structure that has already been written in situ and to correct deviations from a desired target structure directly. As a result, structures can be produced with a high level of accuracy with a comparatively small expenditure of time and equipment. In particular, the method makes it possible to detect a deviation from a desired target structure directly on the structure that has already been produced, without the structure having to be prepared beforehand for the analysis.

In particular, no development of the lithographic material takes place between defining the structure (step b) and analyzing the structure (step c). In particular, therefore, no unexposed lithographic material is removed, nor is the structure already produced on the basis of the exposure data set hardened. With such a method, a written structure can thus be optimized in situ, which enables faster cycle times. In particular, the method makes it possible to automate structural optimization, since complex development steps are no longer necessary.

The exposure dose (exposure variation) can be modified by laser modulation, for example by means of acousto-optical modulators known from the prior art, or by means of automated polarizers. The exposure can also be varied using other beam shaping methods, in which the amplitude, phase or polarization of the laser writing beam can be adjusted.

In the present context, lithographic material is generally used to refer to substances whose chemical and/or physical material properties can be modified by irradiation with a writing laser beam, for example so-called lithographic lacquers. Depending on the type of modifications induced by the writing beam, lithographic materials can be divided into so-called negative resists (in which irradiation causes local hardening, or solubility in a developer medium is reduced), and so-called positive resists (in which irradiation locally increases solubility in a developer medium).

According to an advantageous development, steps c) to f) of the method explained above, that is, analyzing the structure and determining the at least one analysis data set (step c), determining a deviation data set (step d), determining at least one correction exposure data set (step e), and defining the correction structure (step f), are repeated iteratively, such that the deviation of an actually defined structure from the desired target structure is increasingly reduced, i.e., within the process of each iteration. In other words, after the correction structure has been written, the resulting structure is analyzed again and, if necessary, a further correction structure is written. Steps c) to f) are preferably repeated iteratively until the determined deviation falls below a prespecified or prespecifiable threshold value, in particular a threshold value that is or can be stored in a control device.

The imaging measurement method used to analyze the defined structure can in particular be an optical microscopy method, more particularly non-linear microscopy. It can be contemplated, for example, that the structure being analyzed is first illuminated with excitation light, and the reflected radiation that is backscattered, reflected or transmitted by the structure being analyzed is detected by means of an optical measuring device. The measuring device can in particular comprise measuring optics, which are preferably formed confocally with the device (for example, a beam guide device) that generates the laser writing beam. It can also be particularly advantageous if the laser writing beam passes through a lens into the lithographic material to define a structure, and if this lens is also used to collect the radiation emitted by the structure to be analyzed. In principle, however, it is also possible for a separate measuring device, in particular a separate lens, to be used for the microscopy.

In particular, the structure is analyzed by means of confocal fluorescence microscopy. In this respect, in particular a fluorescence signal which is generated by the lithographic material when excitation light is irradiated into the lithographic material is evaluated. Depending on whether the lithographic material is in its unmodified initial state (for example, in an unpolymerized state) or in a state modified by the laser writing beam (for example, in a polymerized state), different fluorescence signals are generated, such that a structural contrast can be detected.

In a particularly advantageous embodiment of the method, for the purpose of analyzing the already defined structure, the same can be optically scanned with the laser writing beam for imaging, and the radiation which is backscattered, reflected, transmitted, or generated by fluorescence is detected by means of a measuring device. In this respect, the laser writing beam is used to illuminate the structure being analyzed with excitation light. This scanning with the laser writing beam itself has the advantage that no additional imaging devices are required. In addition, an analysis can be carried out particularly quickly in this way, since in particular no conversion of the optics is required. For scanning the structure, the exposure dose is preferably selected to be low enough that no structure is defined in the lithographic material during the scanning. In particular, a laser intensity is selected which is below the threshold value at which appreciable polymerization of the lithographic material takes place (polymerization threshold). It is also possible for the structure being examined to be illuminated with laser light of a different laser wavelength, which wavelength has such low linear or nonlinear absorption in the lithographic material that no structure is defined in the lithographic material during scanning.

In addition or as an alternative, the already defined structure can also be analyzed by mechanically scanning it—in the manner of an atomic force microscope—using a scanning tip, for example in the form of a needle. Such a configuration is particularly advantageous in the case of lithographic materials that are liquid in the initial state.

According to an advantageous development, the target structure can be defined by a plurality of partial structures being defined sequentially, which together at least approximate the target structure. Such a configuration is particularly advantageous if the target structure to be produced is larger than the maximum writing region of the laser lithography apparatus. To generate the partial structures, the target structure is preferably rastered by computer, in particular broken down into structure regions (voxels), and the partial structures are each formed by a preferably contiguous set of structure regions (voxels). To generate the partial structures, further partial exposure data sets are then determined by computer from the at least one exposure data set or the at least one correction exposure data set, which data sets represent a local exposure dose for a scan manifold for each partial structure. In particular, after each partial structure has been defined, the writing region of the laser lithography apparatus is displaced, for example by means of positioning means known from the prior art.

In principle, the partial structures can have different shapes. If the target structure to be produced has an extension in the height direction which is greater than a maximum writing height of the laser lithography apparatus, it can be particularly advantageous if the target structure is broken down at least in sections into partial structures stacked on top of one another in layers. In this respect, at least a subset of the partial structures is designed in such a way that the target structure is approximated by a plurality of partial structures stacked on top of one another in layers, that is, one on top of the other in the height direction. After the writing of each partial structure, the lithographic material and/or a substrate with the lithographic material is then moved downwards in a controlled manner, in particular by means of a positioning device.

According to an advantageous development, the at least one exposure data set and the at least one correction exposure data set can each include at least one grayscale image data set, in which different gray values represent different exposure doses. In particular, the at least one exposure data set and the at least one correction exposure data set each consist of a grayscale image data set. In this respect, the data sets can be visualized as grayscale images. In particular, the laser lithography apparatus is controlled as a function of the grayscale image data sets. The at least one exposure data set is preferably provided by reading a grayscale image file into a control device of the laser lithography apparatus, and storing it in a memory.

If, as explained above, the target structure is built up from partial structures stacked on top of one another in layers, then, if the at least one exposure data set and the at least one correction exposure data set are designed as grayscale image data sets, the grayscale image data set of the at least one exposure data set and/or the grayscale image data set of the at least one correction exposure data set is split into a plurality of partial grayscale image data sets. The partial grayscale image data sets then together represent an image stack along the stacking direction of the partial structures. The highest gray value of each grayscale image then corresponds to an exposure dose which leads to a maximum structure height that can be written with the laser lithography apparatus in one plane (that is, without the lithographic material having to be moved in the height direction relative to the focus region of the laser writing beam).

According to an advantageous refinement, the at least one analysis data set can also include at least one grayscale image data set, and in particular can consist of it, having different gray values representing different structure heights of the analyzed structure. Then the deviation data set, and in particular also the correction exposure data set, can be determined by comparing the at least one analysis data set with the at least one exposure data set.

The object stated at the outset is also achieved by a laser lithography apparatus according to claim 12. The laser lithography apparatus is designed to produce a three-dimensional target structure in a lithographic material. The laser lithography apparatus comprises a laser source for emitting a laser writing beam. In addition, the laser lithography apparatus comprises a beam guide device, in particular comprising optical means such as lenses, mirrors, etc., for defining a beam path for the laser writing beam from the laser source to the lithographic material. In addition, focusing optics are provided, which are designed to focus the laser writing beam in a focus region. A scanning device is also provided for displacing the focus region of the laser writing beam relative to the lithographic material. The scanning device can be a deflection device (for example, comprising deflection mirrors) for modifying a position of the focus region of the laser writing beam in the lithographic material. Additionally or alternatively, the scanning device can also comprise a positioning device, by means of which the lithographic material or a substrate with the lithographic material can be displaced relative to the laser writing beam.

The laser lithography apparatus also comprises an imaging measuring device for analyzing a structure defined or written in the lithographic material by means of the laser writing beam. In particular, the measuring device can comprise a detection device for detecting radiation which is backscattered, reflected, transmitted or generated by fluorescence from the structure being analyzed. In addition or as an alternative, it is possible for the measuring device to include a probe with a scanning tip, by means of which the structure can be scanned mechanically.

The laser lithography apparatus also comprises a control device which is configured to carry out the methods explained above. The control device includes, in particular, a computing unit and a non-volatile memory in which the data sets explained above are or can be stored.

In the following, the invention will be described in more detail using the drawings.

Figure 2A:
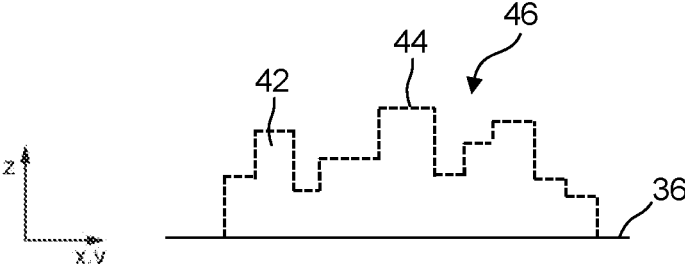
Figure 3:
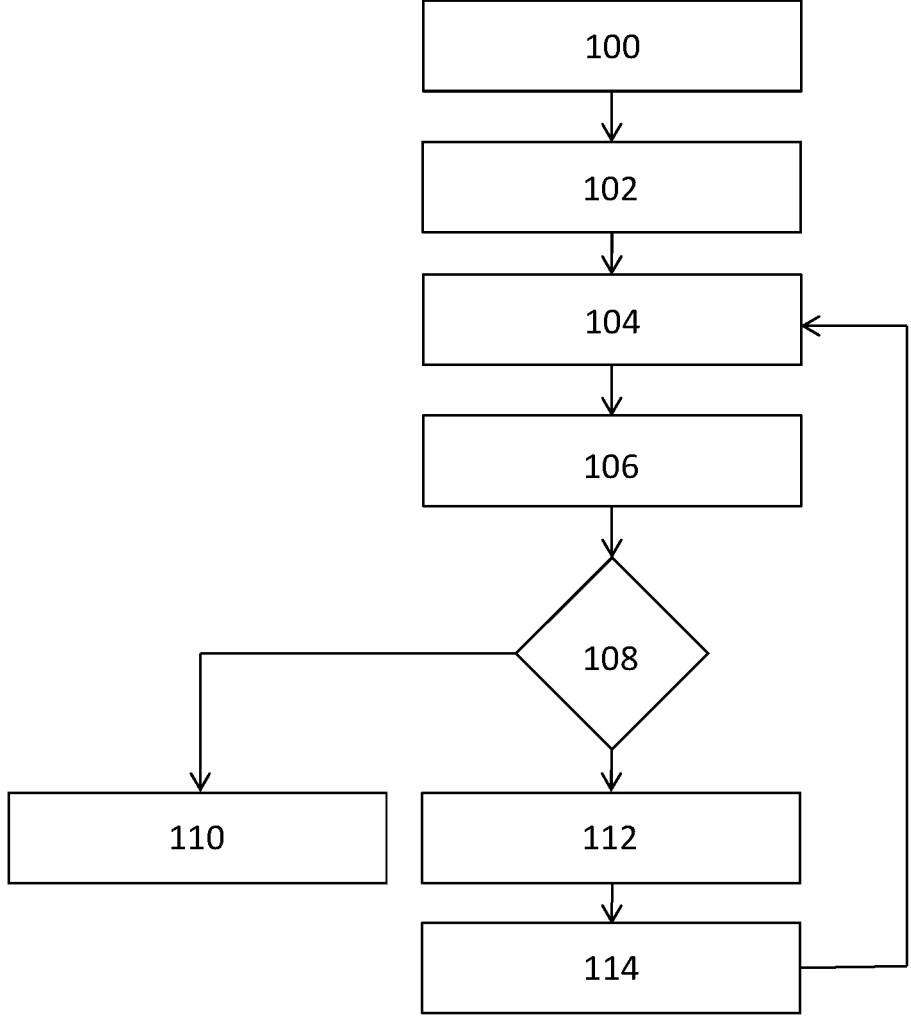
Figure 4:
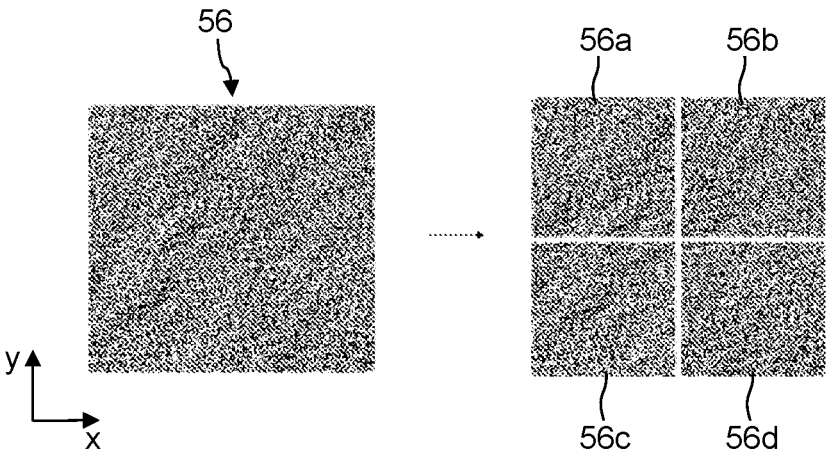
Figure 5:
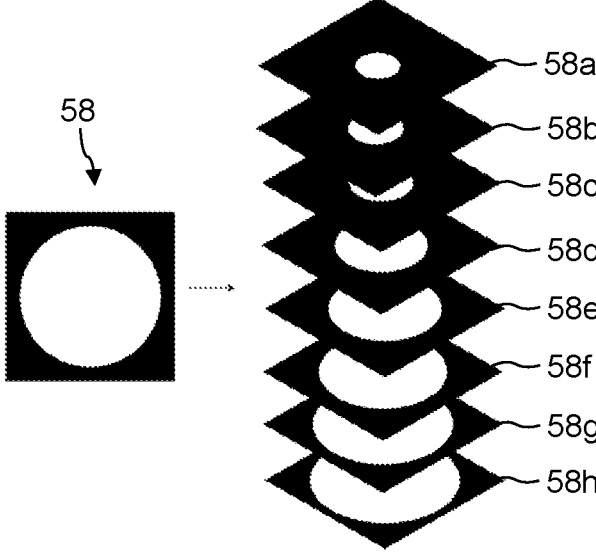

In the drawings:

FIG. 1 is a simplified schematic illustration of a laser lithography apparatus;

FIG. 2a, b are sketched illustrations to explain sub-steps of the method for generating a three-dimensional structure;

FIG. 3 is a schematic flow chart of an embodiment of the method for generating a three-dimensional structure; and FIGS. 4 and 5 are sketched illustrations to explain the division of the exposure data set into partial exposure data sets.

In the following description and in the drawings, the same reference signs are used for identical or corresponding features.

FIG. 1 is a schematic illustration of a laser lithography apparatus, which is denoted overall by the reference number 10. The laser lithography apparatus 10 comprises a laser source 12 for emitting a laser writing beam 14. The laser lithography apparatus 10 also comprises a beam guide device 16 for defining a beam path 18 for the laser writing beam 14 from the laser source 12 to a lithographic material 20 to be structured, which is shown by way of example as a bath of liquid material.

In the example shown, the beam guide device 16 has a plurality of modules which fulfill optical and/or mechanical functions. For example, the beam path 16 can first run through a modulation module 22 to shape suitable beam pulses. The laser lithography apparatus 10 also comprises focusing optics 24 for focusing the laser writing beam 14 in a focus region 26 (see also FIG. 2a) of the laser writing beam 14. The focusing optics 24 include, for example, a lens module 28 through which the laser writing beam 14 is irradiated into the lithographic material 20.

In the example shown, the laser lithography apparatus 10 also comprises a scanning device 30 by means of which the focus region 26 of the laser writing beam 14 can be displaced in a writing region 32 relative to the lithographic material 20 with a precision required for structuring. In the example shown, the scanning device 30 comprises a beam directing module 34, which can comprise, for example, a galvanometer scanner unit for the controlled deflection of the laser beam 14. In embodiments that are not shown, it is also possible for the scanning device 30 to include a positioning device, which serves to move the lithographic material 20 or the substrate 36 with the lithographic material 20 relative to the focus region 26 of the laser writing beam 14 with precision. The figures also show a coordinate system with mutually orthogonal axes x, y, z, wherein the x-axis and the y-axis define a writing plane, and the z-axis corresponds to a vertical direction.

The laser lithography apparatus 10 also comprises a control device (not shown), which comprises a computing unit and a non-volatile memory.

In order to generate a three-dimensional structure in the lithographic material, the focus region 26 of the laser writing beam 14 is displaced by the scanning device 30 relative to the lithographic material 20, such that the focus region 26 travels through a scan manifold (indicated by the arrow 38 in FIG. 1) through the lithographic material 20. In the focus region 26 of the laser writing beam 14, an exposure dose is irradiated locally into the lithographic material 20, such that structure regions 40 (see FIG. 2b) are defined locally, in particular utilizing multi-photon absorption. For example, the lithographic material 20 is locally polymerized, and thus structured.

An advantageous embodiment of the method for producing a three-dimensional structure by means of a laser lithography apparatus, in particular by means of the laser lithography apparatus 10 explained above, is explained below with reference to FIGS. 2a to 5.

FIG. 2a schematically shows, in a sectional view, an example of a target structure which is to be written in a volume of lithographic material 20 by means of 3D laser lithography. The target structure 42 is denoted by the reference number 42 in FIG. 2a, and has an outer surface 44 which is shown in dashed lines in FIG. 2a. In the example shown, the target structure 42 has a pronounced height profile 46, which is used to explain the effects of a change in the exposure dose. Of course, however, other geometries are also conceivable. For example, the outer surface 44 of 42 can also have a profile with different gradients or curves.

For the lithographic production of the target structure 42, an exposure data set is first provided, which represents a local exposure dose for the scan manifold 38 as a function of location (step 100 in FIG. 3). The exposure data set can in particular be a grayscale image data set representing the target structure 42. For example, it is possible for a grayscale image file to be read into the control device of the laser lithography apparatus 10. It is also possible that initially a structure data set representing the target structure 42 is provided (for example, CAD data), and the exposure data set is then determined by computer from this structure data set.

Figure 2B:
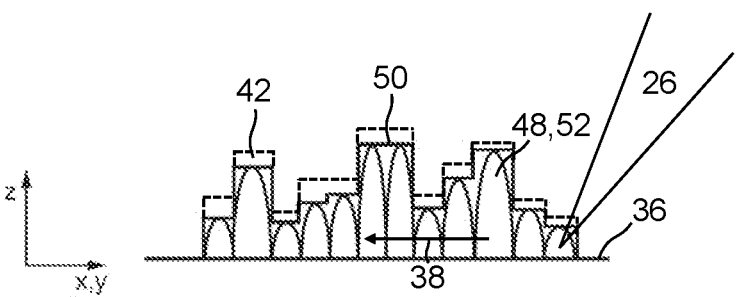

In a next step (step 102 in FIG. 3), the laser lithography apparatus 10 is then controlled in accordance with the exposure data set, such that a structure 48 that at least approximates the target structure 42 is produced (an outer surface of this structure is drawn with continuous lines in FIG. 2b, and denoted by reference number 50). As shown by way of example in FIG. 2a, the structure 48 can be defined, for example, by the focus region 26 travelling through a scan manifold 38, and in the process emitting a sequence of laser pulses with a defined pulse rate and pulse length. This defines a series of structure regions 52 (voxels) along the scan manifold 38 which form the structure 48. The structure regions 52 are similar in shape or identical in shape to one another. The size of a written structure region 52 and thus a structure height is related to the absorbed exposure dose.

Due to different effects (for example, locally different response of the lithographic material to the laser input, optics errors, inclination of the substrate 36, etc.) the structure 48 generated on the basis of the exposure data set usually does not exactly correspond to the desired target structure 42. According to the method, in a further step (step 104 in FIG. 3), the already defined structure 48 is therefore analyzed, and in particular the topography or shape of the defined structure 48 is measured. This takes place in situ, that is, in particular without the lithographic material 20 or the defined structure 48 being first developed. According to a first embodiment, the defined structure 48 is examined using confocal fluorescence microscopy, wherein the already defined structure 48 is first optically scanned using the laser writing beam 14, and then the fluorescence signal emitted by the sample is analyzed. For this purpose, the laser lithography apparatus 10 can then have a corresponding measuring device 54 (see FIG. 1), for example a fluorescence detector. By way of example and preferably, a beam path of the radiation emitted by the sample runs along the beam path of the laser writing beam.

It is also possible for the structure 48 to be mechanically scanned by means of a scanning tip (not shown) in order to analyze it. In this case, the laser lithography apparatus 10 may include a scanner (not shown).

During and/or after the analysis of the structure 48, an analysis data set is then determined which represents the defined structure 48, in particular its topography or shape. By way of example and preferably, the analysis data set is also a grayscale image data set, with different gray values representing different structure heights (in the z-direction).

In a further step (step 106 in FIG. 3), a deviation data set is now determined by comparing the exposure data set representing the target structure 42 and the analysis data set, which represents deviations of the already defined structure 48 from the target structure 42 (see FIG. 2*b*). In particular, the deviation data set can be determined by the difference between the grayscale image data sets of the exposure data set and the analysis data set.

A check is then carried out to determine whether or not the determined deviation falls below a prespecified threshold value (step 108 in FIG. 3). It is therefore checked whether the already defined structure 48 already adequately corresponds to the desired target structure 42. If this is the case, the method is ended (step 110 in FIG. 3). However, if the deviation is above the threshold value, in a further step a correction exposure data set is determined on the basis of the deviation data set (step 112 in FIG. 3), which represents a corrected exposure dose for each scan point of the scan manifold 38, in order to compensate for or at least reduce the deviations from the target structure 42.

In a further step, the laser lithography apparatus 10 is then controlled on the basis of the correction exposure data set (step 114 in FIG. 3), so that a correction structure is defined. It is possible that, on the basis of the correction exposure data set, a "new" structure that is spatially separate from the structure defined on the basis of the exposure data set is generated, in particular at a different position on the substrate 36. It is also possible for the correction structure to be used only for post-correction of the structure previously written on the basis of the at least one exposure data set. In this case, in particular the focus region 26 of the laser writing beam 14 can once again travel the previously traversed scan manifold 38, with the appropriately adapted exposure dose being used as a function of the location, according to the correction exposure data set.

The steps 104 to 114 are repeated iteratively until a determined deviation of the structure 48 actually produced from the desired target structure 42 falls below the threshold.

If the desired target structure 42 is larger than the maximum writing region 34 of the laser lithography apparatus 10, the target structure 42 can be computationally broken down into partial structures that approximate the target structure 42 together. In order to generate the partial structures, further partial exposure data sets are then determined by computer, in particular from the at least one exposure data set, which represent a local exposure dose for a scan manifold 38 for each partial structure. The partial structures are then written sequentially and the resulting structure is analyzed and optimized according to the method explained above. In this case, the analysis data set, the deviation data set, and/or the correction exposure data set are optionally broken down into partial data sets according to the partial structures.

FIG. 4 depicts the example of a case in which the target structure has a greater extension in the scan plane (x-y plane) than the write area 34 of the laser lithography apparatus 10. A grayscale image 56 representing the exposure data set is shown as an example in FIG. 4. As shown by way of example in FIG. 4, the grayscale image 56 or the exposure data set can be broken down into partial grayscale images 56*a-d* and/or partial grayscale image data sets, on the basis of which the partial structures are then written.

In the event that an extension of the target structure 42 in the height direction (z-direction) is greater than a maximum writing height of the laser lithography apparatus 10 per scan plane, the target structure 42 can be broken down, for example, into partial structures stacked on top of one another in layers. This case is depicted in sketched form in FIG. 5. To define the partial structures, the exposure data set (depicted in FIG. 5 by the grayscale image 58) can then be broken down into a plurality of partial exposure data sets (depicted in FIG. 5 by a stack of corresponding grayscale images 58*a-h*). The grayscale images 58 and 58*a-h* are shown in FIG. 5 only in sketched form to explain the image stack. In particular, however, each grayscale image 58 or 58*a-h* in FIG. 5 corresponds to an image in the manner of the grayscale images 56 shown in FIG. 4.

The invention claimed is:

1. A method for producing a three-dimensional target structure in a lithographic material by means of a laser lithography apparatus, wherein the target structure is defined in that, within a writing region of the laser lithography apparatus, a focus region of a laser writing beam travels through a scanning manifold through the lithographic material, wherein, in the focus region of the laser writing beam, an exposure dose is irradiated into the lithographic material and a structure region is locally defined, the method comprising:

a) providing at least one exposure data set which represents a local exposure dose for the scan manifold as a function of location;

b) defining a structure which approximates the target structure on the basis of the at least one exposure data set, wherein the structure is defined utilizing multi-photon absorption, wherein the lithographic material is designed in such a way and the laser writing beam is tuned to the lithographic material in such a way that a change in the lithographic material is only possible by means of the absorption of multiple photons;

c) analyzing an already defined structure, said already defined structure being defined according to b), by means of a spatially resolving imaging measurement method and determining at least one analysis data set which represents the analyzed structure;

d) determining a deviation data set, which represents deviations of the already defined structure from the target structure;

e) determining at least one correction exposure data set which represents a correction exposure dose required for compensating for the deviations for the scan manifold as a function of location; and f) defining a correction structure based on the at least one correction exposure data set.

2. The method according to claim 1, wherein no development of the lithographic material occurs between defining the structure and analyzing the structure.

3. The method according to claim 1, wherein steps c) to f) are repeated iteratively in such a way that the deviation of the already defined structure from the target structure is increasingly reduced, until the determined deviation falls below a prespecified or prespecifiable threshold value.

4. The method according to claim 1, wherein the defined structure is analyzed by means of optical microscopy.

5. The method according to claim 4, in which, in order to analyze the already defined structure, the same is scanned with the laser writing beam and, for imaging, the backscattered, reflected, transmitted or fluorescence-generated radiation is detected by means of a measuring device, wherein an exposure dose for scanning is selected to be low enough that no structure is defined in the lithographic material.

6. The method according to claim 4, in which, in order to analyze the already defined structure, the same is scanned with the laser writing beam and, for imaging, the backscattered, reflected, transmitted or fluorescence-generated radiation is detected by means of a measuring device.

7. The method according to claim 1, in which, in order to analyze the already defined structure, the same is mechanically scanned with a scanning tip.

8. The method according to claim 1, wherein the target structure is defined by a plurality of partial structures being defined sequentially, which together approximate the target structure, wherein further partial exposure data sets are determined by computer for defining the partial structures from the at least one exposure data set and/or the at least one correction exposure data set, which represent a local exposure dose along a scan manifold for each partial structure.

9. The method according to claim 8, in which the partial structures are stacked on top of one another in layers.

10. The method according to claim 8, wherein the at least one exposure data set and the at least one correction exposure data set each comprise at least one grayscale image data set, wherein different gray values represent different exposure doses, and wherein, in order to determine the partial exposure data sets, the at least one grayscale image data set of the at least one exposure data set and/or the at least one correction exposure data set is divided into a plurality of partial grayscale image data sets which together form an image stack along the stacking direction of the partial structures.

11. The method according to claim 1, wherein the at least one exposure data set and the at least one correction exposure data set each comprise at least one grayscale image data set, wherein different gray values represent different exposure doses.

12. The method according to claim 11, wherein the at least one analysis data set also comprises at least one grayscale image data set, wherein different gray values represent different structure heights, and wherein the deviation data set is determined by comparing the at least one analysis data set to the at least one exposure data set.

13. A laser lithography device for producing a three-dimensional target structure in a lithographic material, the laser lithography device comprising:

a laser source configured and/or programmed to emit a laser writing beam, a beam guide device configured and/or programmed to define a beam path for the laser writing beam from the laser source to the lithographic material, focusing optics configured and/or programmed to focus the laser writing beam in a focus region, a scanning device configured and/or programmed to displace the focus region of the laser writing beam relative to the lithographic material, an imaging measuring device configured and/or programmed to analyze an already defined structure, and a control device which is configured and/or programmed to carry out the method according to claim 1.

14. The method according to claim 1, wherein steps c) to f) are repeated iteratively in such a way that the deviation of the already defined structure from the target structure is increasingly reduced.

15. The method according to claim 1, wherein the defined structure is analyzed by means of confocal fluorescence microscopy.

16. A method for producing a three-dimensional target structure in a lithographic material, the method comprising:

providing at least one exposure data set which represents a local exposure dose for a scan manifold as a function of location;

defining a structure which approximates a target structure on a basis of the at least one exposure data set, wherein the structure is defined utilizing multi-photon absorption, wherein the lithographic material is designed in such a way and the laser writing beam is tuned to the lithographic material in such a way that a change in the lithographic material is only possible by means of the absorption of multiple photons;

analyzing an already defined structure by a spatially resolving imaging measurement method providing an analyzed structure;

determining at least one analysis data set which represents the analyzed structure;

determining a deviation data set, which represents deviations of the already defined structure from the target structure;

determining at least one correction exposure data set which represents a correction exposure dose required for compensating for the deviations for the scan manifold as the function of location; and defining a correction structure based on the at least one correction exposure data set.

* * * * *